(12) United States Patent
Chang et al.

(10) Patent No.: US 7,710,802 B2
(45) Date of Patent: May 4, 2010

(54) METHOD FOR TESTING MEMORY

(75) Inventors: Chin-Hung Chang, Tainan (TW);
Wen-Chiao Ho, Tainan (TW);
Kuen-Long Chang, Taipei (TW);
Chun-Hsiung Hung, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 217 days.

(21) Appl. No.: 11/850,061

(22) Filed: Sep. 5, 2007

(65) Prior Publication Data
US 2009/0059698 A1    Mar. 5, 2009

(51) Int. Cl.
*G11C 7/00* (2006.01)
(52) U.S. Cl. .................. 365/201; 365/200; 365/189.08; 714/718
(58) Field of Classification Search ................. 365/201, 365/200, 189.08; 714/718
See application file for complete search history.

(56) References Cited

U.S. PATENT DOCUMENTS

| | | | |
|---|---|---|---|
| 6,373,758 B1* | 4/2002 | Hughes et al. | 365/200 |
| 6,950,334 B2* | 9/2005 | Shimizu et al. | 365/158 |
| 2003/0221145 A1* | 11/2003 | Stong et al. | 714/718 |
| 2006/0161824 A1* | 7/2006 | Brummel et al. | 714/718 |

* cited by examiner

*Primary Examiner*—Anh Phung
*Assistant Examiner*—Toan Le
(74) *Attorney, Agent, or Firm*—Thomas, Kayden, Horstemeyer & Risley

(57) ABSTRACT

A method for testing a memory includes the following steps. First, data is read from the memory and stored to a first temporary memory. Meanwhile, expected data corresponding to the data from the memory is written into a second temporary memory from a tester. Thereafter, the data in the first temporary memory and the expected data in the second temporary memory are compared with each other to judge whether the memory has an enough operation window.

10 Claims, 4 Drawing Sheets

METHOD FOR TESTING MEMORY

BACKGROUND OF THE INVENTION

1. Field of the Invention

The invention relates in general to a method for testing a memory, and more particularly to a method for testing a memory at a high speed.

2. Description of the Related Art

Non-volatile memories have been used in various applications. Data may be read from or written into the non-volatile memory, and the data stored in the non-volatile memory can be kept without power. So, the non-volatile memory may be adapted to various data storage applications.

The memory usually includes multiple chips each including multiple memory cells arranged in an array. Each memory cell is enabled by a corresponding word line. FIG. 1 (Prior Art) shows a threshold voltage distribution of a memory. The difference between a high bound HB of a low-threshold voltage distribution 102 and a low bound LB of a high-threshold voltage distribution 104 is a memory operation window S1, in which the memory actually operates.

If the memory is a pre-programmed memory, the predetermined data has to be programmed in the memory before the memory is shipped to a customer. At this time, if the operation window of the memory is not sufficient, the memory may have an error when the memory cell is processed (e.g., programmed or read). Thus, a margin threshold voltage test (margin VT test) is usually performed on the memory after being manufactured so that the chip with the insufficient operation window is found and then shielded.

FIG. 2 (Prior Art) is a flow chart showing a conventional method for testing a memory. First, in step 210, page data is read from the memory and stored to a register of the memory. After the page data is stored to the register, the tester reads the page data out from the register of the memory, as shown in step 220.

Then, in step 230, the page data is compared with expected data, corresponding to the page data, in the tester. Step 230 is performed to substantially verify the correctness of the page data. If the page data is the same as the expected data, it is judged that the memory has the enough operation window in step 240. At this time, it informs the tester that the memory has passed the test. If the page data is different from the expected data, it is judged that the memory does not have the enough operation window in step 250. At this time, it informs the tester that the test fails, and the memory is shielded.

In the method for testing the memory, the page data has to be read out from the memory, and then the correctness of the page data is verified in the tester in order to judge whether the enough operation window is possessed. The time for reading the page data out from the memory becomes longer with the gradually increased memory density. In addition, a lot of time has to be spent to compare the page data with the expected data in the tester.

Illustration will be made by taking the memory including 2 G bits of multi-level cells as an example, in which the size of the page data is 512 bytes, the output data clock is 50 ns/byte and the time for internally reading the page data (latency) is 30 μs. In the conventional method for testing the memory, the testing time is equal to (30 μs+(50 ns×512))×2×(2048 Mbit/512 byte)=58.3 seconds. Consequently, the long testing time increases the testing cost for the memory.

SUMMARY OF THE INVENTION

The invention is directed to a method for testing a memory, in which expected data is loaded into the memory from a tester while data is read out from the memory and stored. Thus, the testing time can be greatly shortened, and the testing cost for the memory can be reduced.

According to the present invention, a method for testing a memory is provided. The method includes the following steps. First, data is read from the memory and stored to a first temporary memory. Meanwhile, expected data corresponding to the data from the memory is written into a second temporary memory from a tester. Thereafter, the data in the first temporary memory and the expected data in the second temporary memory are compared with each other to judge whether the memory has an enough operation window.

The invention will become apparent from the following detailed description of the preferred but non-limiting embodiments. The following description is made with reference to the accompanying drawings.

DETAILED DESCRIPTION OF THE INVENTION

The invention provides a method for testing a memory, in which expected data is loaded into the memory from a tester while data is read from the memory and stored. Thus, the testing time can be greatly shortened, and the testing cost for the memory can be reduced.

Figure 1:
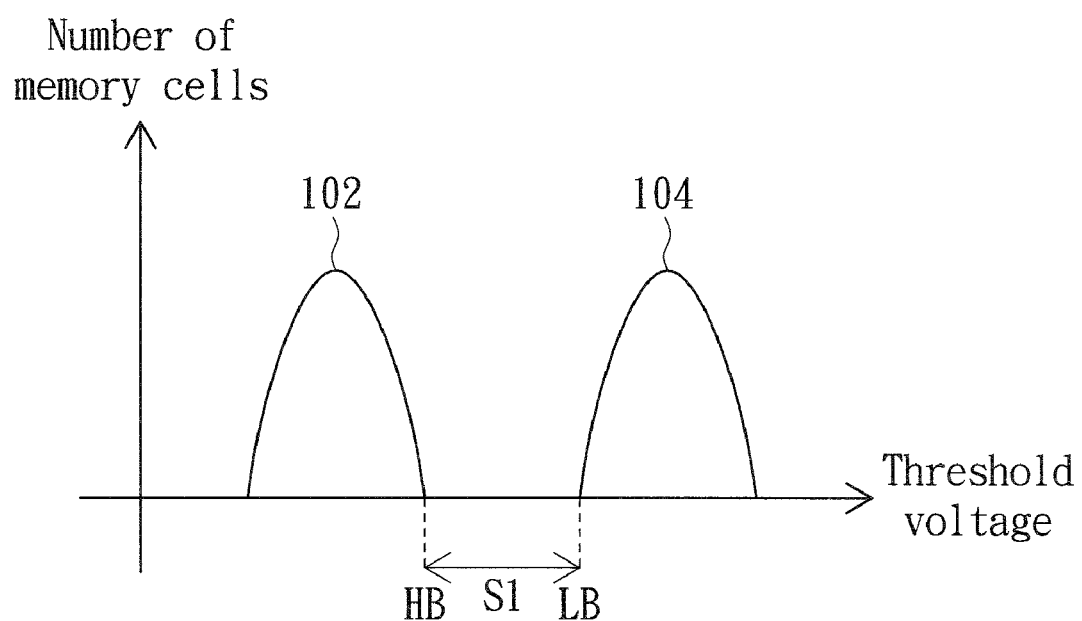
FIG. 1 (Prior Art) shows a threshold voltage distribution of a memory.
Figure 2:
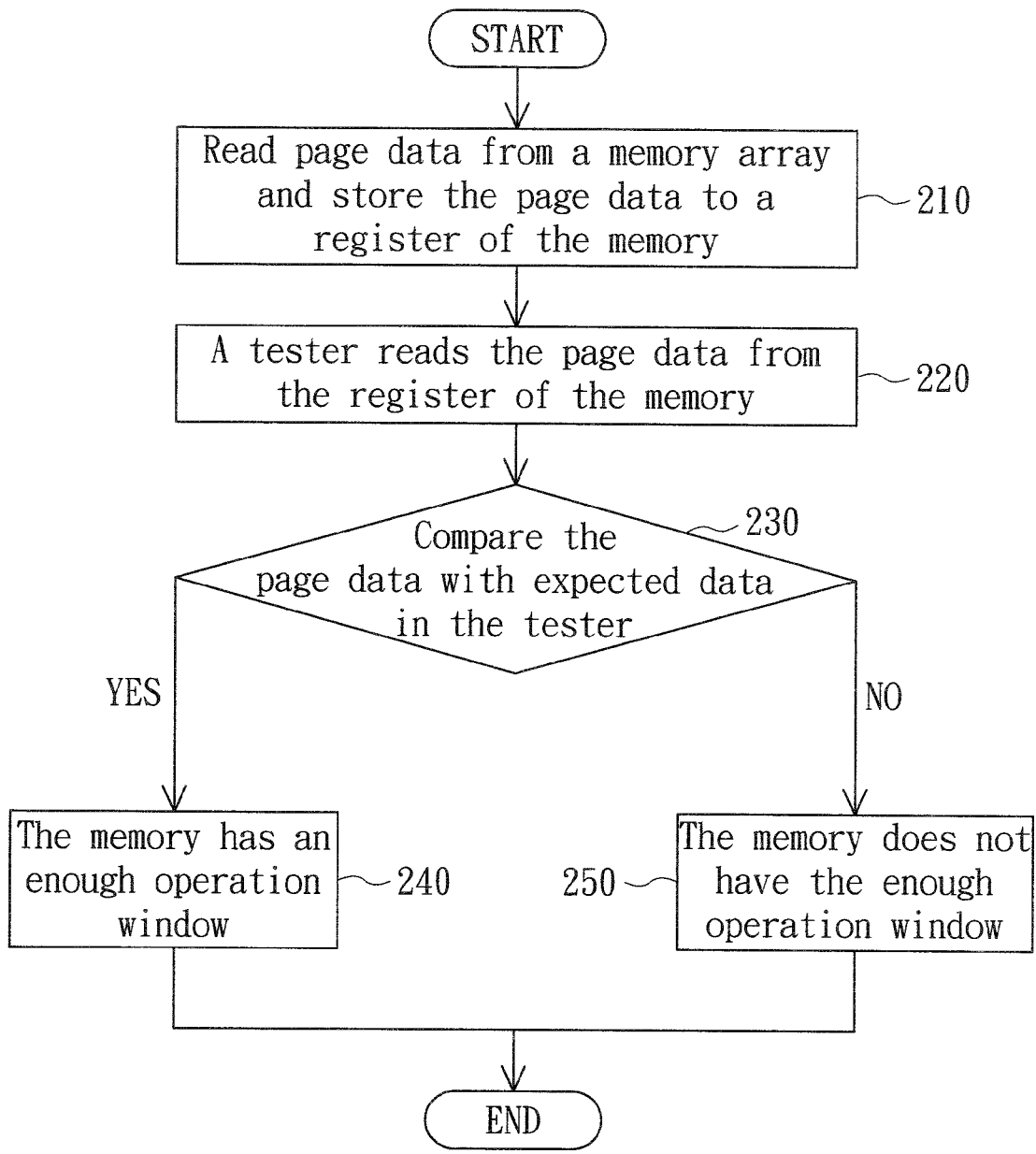
FIG. 2 (Prior Art) is a flow chart showing a conventional method for testing a memory.
Figure 3:
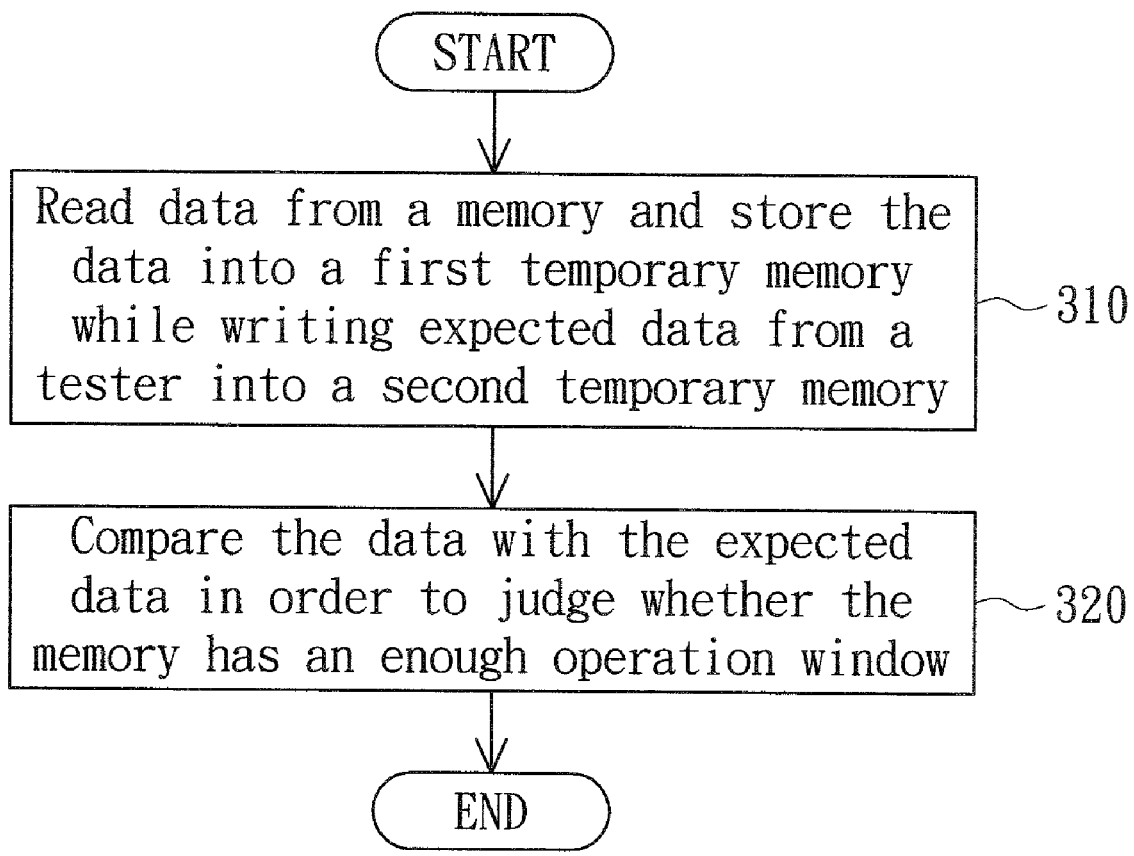
FIG. 3 is a flow chart showing a method for testing a memory according to a preferred embodiment of the invention.

FIG. 3 is a flow chart showing a method for testing a memory according to a preferred embodiment of the invention. As shown in FIG. 3, the method is applied to the memory, which includes multiple memory cells arranged in an array. Each memory cell is enabled by a corresponding word line. A threshold voltage distribution of the memory is depicted in FIG. 1. The memory may be a non-volatile memory or a flash memory, for example.

First, in step 310, data is read from the memory and stored to a first temporary memory. The data is substantially stored in the memory cells of the memory in advance. While the data is being read, expected data is written into a second temporary memory from a tester. The expected data corresponds to the data. Then, in step 320, a comparator in the memory compares the data in the first temporary memory with the expected data in the second temporary memory to judge whether the memory has an enough operation window.

Figure 4:
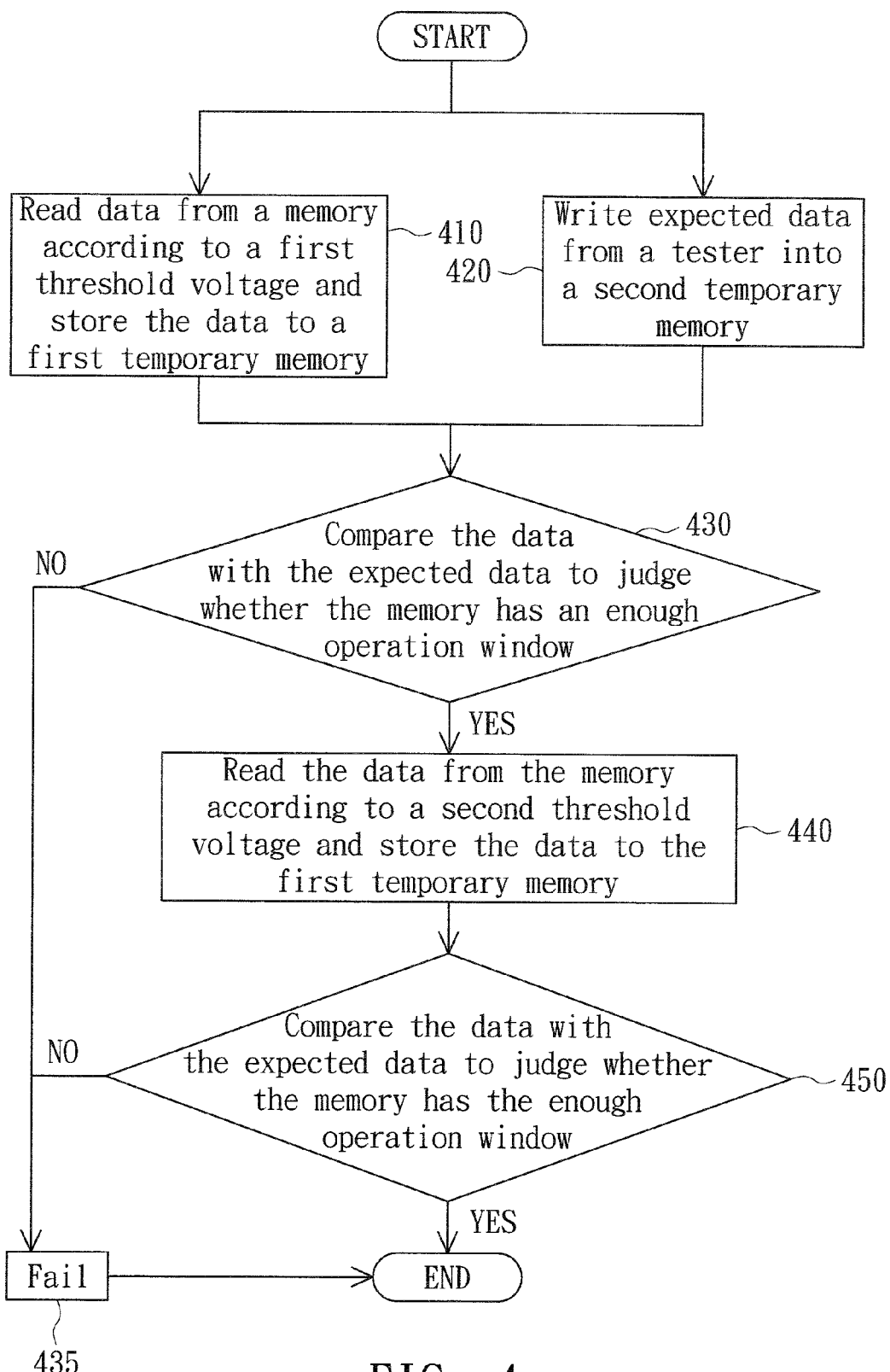
FIG. 4 is a detailed flow chart showing a method for testing the memory according to the preferred embodiment of the invention.

FIG. 4 is a detailed flow chart showing a method for testing the memory according to the preferred embodiment of the invention. In the practical operation, when the memory test starts, the tester enters a margin mode, and then a to-be-tested memory is detected. In step 410, the memory performs an internal reading operation for utilizing a first threshold voltage to enable the memory cells of the memory and thus reading the data, which is stored in the memory cells in advance.

After the data is completely read, the data is stored to the first temporary memory, such as a static random access memory (SRAM), in the memory. The data may be, for example, the data or the program code specified by the customer. The first threshold voltage is substantially equal to a high bound HB of a low-threshold voltage distribution 102 (or a low bound LB of a high-threshold voltage distribution 104).

In addition, when the data is being read, that is, after the margin mode is enabled, the tester writes the expected data into a second temporary memory in the memory, such as a static random access memory (SRAM), in step 420. The expected data corresponds to the data and is substantially the data or the program code specified by the customer. Consequently, the time of the tester for writing the expected data is hidden in the time of the memory for reading the data.

Then, in step 430, the data in the first temporary memory is compared with the expected data in the second temporary memory in order to judge whether the memory has an enough operation window. If the data is different from the expected data, it represents that the low bound (or high bound) of the operation window of the memory is shifted so that the operation window is not enough. At this time, the memory informs the tester that the test fails using a flag, for example. Thereafter, the memory that does not pass the test is shielded.

If the data is the same as the expected data, it represents that the low bound (or high bound) of the operation window of the memory is sufficient to ensure the correctness of the data. At this time, the memory informs the tester that the test passes using a flag, for example. Then, the method continues testing whether the high bound (or low bound) of the operation window of the memory is sufficient to ensure the correctness of the data.

In step 440, the memory again performs the internal reading operation for reading the data using a second threshold voltage to enable the multiple memory cells in the memory and storing the data to the first temporary memory after the data is completely read. Next, in step 450, the data in the first temporary memory is compared with the expected data in the second temporary memory in order to judge whether the memory has the enough operation window. The second threshold voltage substantially is equal to the low bound LB of the high-threshold voltage distribution 104 (or the high bound HB of the low-threshold voltage distribution 102). The difference between the first threshold voltage and the second threshold voltage is substantially the operation window S1 of FIG. 1.

Steps 440 and 450 are performed to substantially test whether the high bound (or low bound) of the operation window of the memory is shifted so that the operation window is not enough. If the data is different from the expected data, it represents that the high bound (or low bound) of the operation window of the memory is shifted so that the operation window is not enough. At this time, the memory informs the tester that the test fails using a flag, for example. Thereafter, the memory that does not pass the test is shielded.

In the method for testing the memory as mentioned hereinabove, steps 430 and 450 are performed to substantially detect two boundaries of the operation window of the memory cells in the memory. In addition, although the flow chart of FIG. 4 is directed to the method for testing the single memory, the invention is not particularly restricted thereto. After the memory has passed the test, the tester can automatically perform the method for testing the next memory until all memories are completely detected.

In the method for testing the memory according to the embodiment of the invention, when the data in the memory is read and stored into the first temporary memory, the expected data is loaded into the second temporary memory from the tester. That is, the time for the tester to write the expected data is hidden in the time of the memory for reading the data. Then, the comparator built in the memory is utilized to verify the correctness of the data in order to judge whether the memory has the enough operation window. Consequently, the conventional time for writing the data into the tester from the memory and verifying the data in the tester can be saved, the testing time can be greatly shortened, and the testing cost for the memory can be decreased.

Illustration will be made by taking the memory including 2 G bits of multi-level cells as an example, in which the size of the data is 512 bytes, the output data clock is 50 ns/byte and the time for internally reading the page data (latency) is 30 μs. In the method for testing the memory according to the invention, the time for testing the memory is equal to 30 μs×2× (2048 Mbit/512 byte)=31.45 seconds. Compared with the conventional method for testing the memory, the testing time is greatly shortened by about 46%.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for testing a memory, the method comprising the steps of:
    reading data from the memory and storing the data to a first temporary memory while writing expected data, which corresponds to the data from the memory, from a tester to a second temporary memory; and
    comparing the data in the first temporary memory with the expected data in the second temporary memory to judge whether the memory has an enough operation window.

2. The method according to claim 1, wherein the memory has the enough operation window when the data is the same as the expected data.

3. The method according to claim 1, wherein the data is read from the memory according to a first threshold voltage, and the data is stored to the first temporary memory while the expected data is written into the second temporary memory, and then the data and the expected data are compared with each other in order to judge whether the memory has the enough operation window.

4. The method according to claim 3, further comprising the steps of:
    reading the data from the memory according to a second threshold voltage and storing the data to the first temporary memory; and
    comparing the data with the expected data in order to judge whether the memory has the enough operation window.

5. The method according to claim 4, wherein the memory has a high-threshold voltage distribution and a low-threshold voltage distribution, the first threshold voltage is a low bound of the high-threshold voltage distribution, and the second threshold voltage is a high bound of the low-threshold voltage distribution.

6. The method according to claim 4, wherein the memory has a high-threshold voltage distribution and a low-threshold voltage distribution, the first threshold voltage is a high bound of the low-threshold voltage distribution, and the second threshold voltage is a low bound of the high-threshold voltage distribution.

7. The method according to claim 4, wherein the operation window is a difference between the first threshold voltage and the second threshold voltage.

8. The method according to claim 1, wherein the first temporary memory and the second temporary memory are static random access memories.

9. The method according to claim 1, wherein the first temporary memory and the second temporary memory consist of registers.

10. The method according to claim 1, wherein the first temporary memory and the second temporary memory are located in the memory, and the comparing step is performed in the memory.

* * * * *